US008660218B2

(12) United States Patent
Maleh et al.

(10) Patent No.: US 8,660,218 B2
(45) Date of Patent: Feb. 25, 2014

(54) SYSTEMS AND METHODS FOR SIGNAL DETECTION AND ESTIMATION

(75) Inventors: Ray Maleh, Greenville, TX (US); Frank A. Boyle, Melissa, TX (US); Gerald L. Fudge, Rockwall, TX (US)

(73) Assignee: L-3 Communications Integrated Systems LP, Greenville, TX (US)

( * ) Notice: Subject to any disclaimer, the term of this patent is extended or adjusted under 35 U.S.C. 154(b) by 229 days.

(21) Appl. No.: 13/361,324

(22) Filed: Jan. 30, 2012

(65) Prior Publication Data

US 2013/0195226 A1 Aug. 1, 2013

(51) Int. Cl.
*H03D 1/00* (2006.01)
*H04L 27/06* (2006.01)

(52) U.S. Cl.
USPC ........... 375/340; 375/342; 375/316; 375/350; 375/354

(58) Field of Classification Search
USPC .......... 375/340, 324, 316, 350, 342, 354, 355
See application file for complete search history.

(56) References Cited

U.S. PATENT DOCUMENTS

| | | | |
|---|---|---|---|
| 7,436,910 B2 | 10/2008 | Fudge et al. | |
| 7,436,911 B2 | 10/2008 | Fudge et al. | |
| 7,436,912 B2 | 10/2008 | Fudge et al. | |
| 8,401,050 B1 * | 3/2013 | Fudge et al. | 375/130 |
| 8,553,808 B2 * | 10/2013 | Luthra | 375/340 |
| 2007/0243839 A1 * | 10/2007 | Kostic | 455/132 |
| 2009/0068951 A1 * | 3/2009 | Mishali et al. | 455/59 |
| 2010/0189208 A1 | 7/2010 | Fudge et al. | |
| 2010/0202566 A1 | 8/2010 | Fudge et al. | |
| 2011/0249703 A1 * | 10/2011 | Najar Marton et al. | 375/138 |
| 2013/0028297 A1 * | 1/2013 | Casey et al. | 375/147 |

OTHER PUBLICATIONS

Slavinksy et al., "The Compressive Multiplexer for Multi-Channel Compressive Sensing", ICASSP, May 2011, 4 pgs.
Capus et al., "The Analysis of Multiple Linear Chirp Signals", The Institution of Electrical Engineers, 2000, 7 pgs.
Mishali et al., "Blind Multi-Band Signal Reconstructions: Compressed Sensing for Analog Signals", IEEE Trans. on Signal Processing, Mar. 2009, 30 pgs.
Mishali et al., "Xampling: Analog to Digital At Sub-Nyquist Rates", CCIT Report #751, EE Pub. No. 1708, Dec. 10, 2009, 16 pgs.
Tropp et al., "Beyond Nyquist: Efficient Sampling of Sparse Bandlimited Signals", IEEE Trans. Info. Theory, vol. 56(1), Jan. 2010, 24 pgs.
Kong et al., "An Analog to Information Converter for Wideband Signals Using a Time Encoding Machine", IEEE, DSP/SPE 2011, 6 pgs.
Tropp et al., "Random Filters for Compressive Sampling and Reconstruction", IEEE, ICASSP 2006, 4 pgs.
Mishali et al., "Xampling Signal Acquisition and Processing in Union of Subspaces", IEEE Trans. on Signal Processing, Jul. 2011, 16 pgs.

* cited by examiner

*Primary Examiner* — Phuong Phu
(74) *Attorney, Agent, or Firm* — Egan, Peterman, Enders LLP.

(57) ABSTRACT

Systems and methods are disclosed for detecting and/or measuring signals contained in modulated sample data, and that may be implemented in one embodiment to detect and measure signals by producing a representation and/or visualization of the signal information of the wide band spectral environment. Signals may be detected and/or measured by demodulating and estimating signal spectra from the modulated sample data that contain the individual signals, and by then forming a frequency representation of the demodulated Nyquist zone spectral estimates into a visual representation in which the frequency of the original signals is visible or otherwise indicated.

21 Claims, 15 Drawing Sheets

Signal 1: RF = 7.90 GHz, IF = 100 MHz, NZ = -19, M-Factor = -10
Signal 2: RF = 3.45 GHz, IF = 250 MHz, NZ = 8, M-Factor = 4

NYFR RF Sample Rate: 800 Msps, ADC Sample Rate: 800 Msps

SYSTEMS AND METHODS FOR SIGNAL DETECTION AND ESTIMATION

This invention was made with United States Government support under Contract No. FA8650-08-C-7852. The Government has certain rights in this invention.

FIELD OF THE INVENTION

This invention relates to signal detection and estimation and, more particularly, to detection and estimation of signals.

BACKGROUND

A wide variety of signals and related protocols exist for the use of radio frequency (RF) signals in communication systems and other devices, such as radar systems. Prior receiver architectures for such RF communication systems are described in U.S. Pat. No. 7,436,910, entitled "DIRECT BANDPASS SAMPLING RECEIVERS WITH ANALOG INTERPOLATION FILTERS AND RELATED METHODS," and U.S. Pat. No. 7,436,912, entitled "NYQUIST FOLDED BANDPASS SAMPLING RECEIVERS AND RELATED METHODS," each of which is hereby incorporated by reference in its entirety.

FIG. 1 (Prior Art) shows an embodiment for a reconfigurable direct RF bandpass sampling receiver (RDRFBSR), such as those described in U.S. Pat. No. 7,436,910. As depicted, the radio frequency (RF) input signal 116 is first passed through a low noise amplifier (LNA) 102. The output 130 of the LNA 102 is provided to a tunable/switchable bandpass filter 104, which can be configured to have a tunable center frequency and a programmable bandwidth dependent upon one or more filter control signals 105. The filtered output signal 132 is received by the non-quantizing sampler 204, which samples the signals at times determined by the RF sample clock 212 resulting in a discrete time continuous voltage sampled signal. The sampled signal is then filtered by the interpolation filter, resulting in a continuous time continuous voltage signal, which is then sampled and quantized by the ADC 210 at sample rate determined by the ADC Sample Clock 214 after optional amplification by the IF amp 208. The digital output signals from the ADC 210 are then further processed by digital signal processing (DSP) circuitry 114 to produce baseband in-phase path (I) and quadrature path (Q) signals.

FIG. 2 (Prior Art) shows an embodiment of a Nyquist folding receiver (NYFR) 200, such as those described in U.S. Pat. No. 7,436,912. The NYFR is similar to the RDRFBSR. Starting with the RDRFBSR, the anti-alias filter is replaced with a wideband pre-select filter, and the constant RF sample clock is replaced with a frequency modulated sample clock that samples at the zero-crossing rising voltage of a frequency modulated clock. In FIG. 2, an ultra wideband (UWB) front end filter 302 is present in front of a non-quantizing RF sampler 204 to allow reception of multiple Nyquist zones. The non-quantizing RF sampler 204 uses modulated RF sample clock circuitry 304, and is followed by an analog interpolation filter 206 and an analog to digital converter (ADC) 210. The ADC 210 receives an ADC sampling clock signal 214 from ADC clock circuitry. The wideband filter 302 has a bandwidth that is wide enough to pass multiple Nyquist zones where the Nyquist zones are determined by the RF sampling clock frequency for the non-quantizing RF sampler 204. The modulated sample clock circuitry 304 provides an RF sampling clock signal to the non-quantizing RF sampler 204 that is not constant and is adjusted or modulated during sampling.

FIG. 3 (Prior Art) shows the input/output characteristics of the NYFR. In particular, an input signal has an induced modulation $M\Theta(t)$, where M depends on the Nyquist zone in which the signal originated. Thus, a broadband RF input can be sampled at far less than Nyquist, allowing individual signals from different Nyquist zones to alias (or fold) into the analog interpolation filter. The original RF frequency from which each signal aliased can then be determined without ambiguity by measuring M.

FIG. 4 (Prior Art) illustrates the principles of the NYFR via a frequency domain example. The Fourier transform of the pulse train, shown in the right side of FIG. 4 (Prior Art), is convolved with the input spectra after the wideband RF filter, which is shown at top left. It is noted that the Fourier transform of the pulse train consists of a series of impulse-like signals with increasing width. For example, the width at 0 $f_{S1}$ is 0; the width at $1f_{S1}$ is the modulation bandwidth; the width at $2f_{S1}$ is 2× the modulation bandwidth; etc. When these are convolved with the input spectra, the resulting spectra has modulation bandwidth corresponding to Nyquist zone of origin as shown in the lower left hand side of FIG. 4 (Prior Art). It is noted that the numbers on the left side of FIG. 4 (Prior Art) correlate to the numbers in FIG. 2 (Prior Art) and show the positions within the circuitry where the signals in FIG. 4 (Prior Art) are present.

Various algorithms and system architectures have been proposed and implemented to solve the problem of detecting and measuring RF signals in the output of such a NYFR, or any other sub-Nyquist folding receiver that has different induced modulations in each Nyquist zone (or fold number). Other examples of receiver architecture that allow for induced modulation in different Nyquist zones include the random filter and random demodulator architectures of the Rice University Compressive Multiplexer (CMUX) which works by bandpassing each Nyquist Zone in multiple channels and then modulating the output of each channel with a different PN sequence. Some alternative architectures utilize high randomized measurements of a wideband RF region, which subsequently require the use of relatively slow compressive sensing algorithms.

SUMMARY OF THE INVENTION

Disclosed herein are systems and methods for detecting and/or measuring signals contained in modulated sample data where the modulation differs for each zone (or equivalence class) within some equal-sized partitioning of the signal space. Such sample data includes, for example, sample data produced by folding or non-folding sampling operations and systems that use non-uniform modulated sampling clocks, orthogonal PN codes, or any other sampling scheme that applies a unique and optionally random modulation to individual sampled zones such that they may be later filtered or demodulated to identify data from particular originally-sampled zones. In the practice of the disclosed systems and methods, RF signals may be detected and measured in modulated sample data of different types including, for example, incoherently modulated sample data, orthogonally modulated sample data, or sample data having modulations that are non-identical but highly correlated.

Examples of sources for such sample data include, but are not limited to the output of a Nyquist Folding Receiver, or the output of any other sub-Nyquist folding or non-folding receiver that has different induced modulations in each Nyquist zone (or fold number). Advantageously, the disclosed systems and methods may be implemented to so detect and measure signals without utilizing highly randomized digital measurements of a wideband region, which would require the use of relatively slow and complex compressive sensing algorithms used by other sub-Nyquist detection and estimation solutions.

Although described herein in terms of an exemplary embodiment in which radio frequency (RF) signals are detected and estimated, it will be understood that the disclosed systems and methods may be similarly implemented for detection of other types of signals within modulated sample data including, but not limited to, audio/ultrasound signals, images data signals, etc.

The disclosed systems and methods may also be implemented in one embodiment to allow identification of certain RF regions in which no strong signals are present and, in one embodiment, the disclosed systems and methods may be implemented to produce a rapid real-time (or near real-time) representation and visualization of the signal information of the wide band spectral environment. The disclosed systems and methods may be implemented in one embodiment in a manner that circumvents the need for complicated compressive sensing algorithms, and/or to provide rapid visualization of a target spectrum, e.g., which may be manually analyzed by an operator with minimal training and/or which may be used as part of an automated detection and estimation algorithm.

In one exemplary embodiment, RF signals in the output of a sub-Nyquist folding receiver that has different induced modulations in each Nyquist zone (or fold number) may be detected and measured using the following steps: in a step (A) the induced modulation for each Nyquist zoned may be removed (i.e., for each fold number, the receiver modulation is removed); then in a step (B) the resulting spectrum for each demodulated Nyquist zone may be estimated (e.g., by performing average FFT magnitude); and then in a step (C) a fold number folded frequency representation of the demodulated Nyquist zone spectral estimates may be formed (e.g., by arranging into a matrix representation with each column of the matrix corresponding to the data demodulated to a particular fold number). In a case where the fold (or Nyquist zone) modulations are orthogonal, the column sequence of step (C) may be arbitrary since a signal will focus into a single fold number with no blurring into other fold numbers. In the case where the fold (or Nyquist zone) modulations are correlated, any signals present will blur (or spectrally spread) in other fold (or Nyquist zone) numbers, so the columns of step (C) may be arranged in sequence of gradually increasing focus. For example, in one exemplary embodiment implemented with a NYFR using a chirping clock with phase modulation theta(t), the induced modulation for each Nyquist zone or fold number is M*theta(t) where M is an integer that varies in a one to one manner with Nyquist zone. For the example case of this embodiment, the columns may be arranged so that M is in a sequence (for example, if 41 folds are present starting at baseband, the columns may be arranged so that M runs from −20 to +20). Finally, in a step (D) the resulting fold number may be searched for, e.g., by searching the folded frequency surface for signal peaks or for regions at the noise floor, depending on the application.

In another exemplary embodiment, the disclosed systems and methods may be implemented to receive sub-Nyquist rate digital samples of a wide-band spectral environment and to efficiently produce and output a convenient fold frequency/ fold number representation and subsequent visualization of the wide band spectral region (sampled at sub Nyquist rate) that may be used to facilitate the detection and RF estimation of both continuous and pulsed signals that are present with or without modulation. The disclosed systems and methods may also be implemented in one embodiment in a manner that resolves the pulse on pulse problem that occurs when two signal components with different RFs fold to the same base band frequency. A visibility adjustment parameter (e.g., a "p-parameter") may be provided in one embodiment that is adjustable to improve the visibility of pulsed signals versus continuous signals.

In one respect, disclosed herein is a signal processing system, including one or more processing devices configured for coupling to receive modulated sample data including one or more signals contained in multiple different sample zones, each of the sampled zones being non-uniformly sampled to induce a unique modulation on signals that is dependent on the particular sample zone of origin. The one or more processing devices of the signal processing system may be programmed to: (a) demodulate each of the one or more signals in each of the multiple non-uniformly sampled sample zones, (b) produce a time-frequency representation of each of the multiple sample zones, (c) obtain a magnitude representation of each given one of the multiple sample zones from a corresponding time-frequency representation for the given sample zone, and (d) create an output magnitude matrix by concatenating the multiple magnitude representations of the multiple sample zones.

In another respect, disclosed herein is a signal receiving and processing system, including a modulated data source configured to sample an input signal to produce modulated sample data from the input signal by applying a unique modulation to individual sampled zones that is dependent on the particular sample zone of origin, the modulated sampling data including one or more signals contained in multiple different sample zones. The system may also include one or more processing devices programmed to: (a) demodulate each of the one or more signals in each of the multiple non-uniformly sampled sample zones, (b) produce a time-frequency representation of each of the multiple sample zones, (c) obtain a magnitude representation of each given one of the multiple sample zones from a corresponding time-frequency representation for the given sample zone, and (d) create an output magnitude matrix by concatenating the multiple magnitude representations of the multiple sample zones.

In another respect, disclosed herein is a method, including providing detection and measurement circuitry implemented by one or more processing devices; and receiving modulated sample data in the detection and measurement circuitry, the modulated sampled data including one or more signals contained in multiple different sample zones, and each of the sampled zones being non-uniformly sampled to induce a unique modulation on signals that is dependent on the particular sample zone of origin. The method may also include using the detection and measurement circuitry to: (a) demodulate each of the one or more signals in each of the multiple non-uniformly sampled sample zones, (b) produce a time-frequency representation of each of the multiple sample zones, (c) obtain a magnitude representation of each given one of the multiple sample zones from a corresponding time-frequency representation for the given sample zone, and (d) create an output magnitude matrix by concatenating the multiple magnitude representations of the multiple sample zones.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

Figure 1:
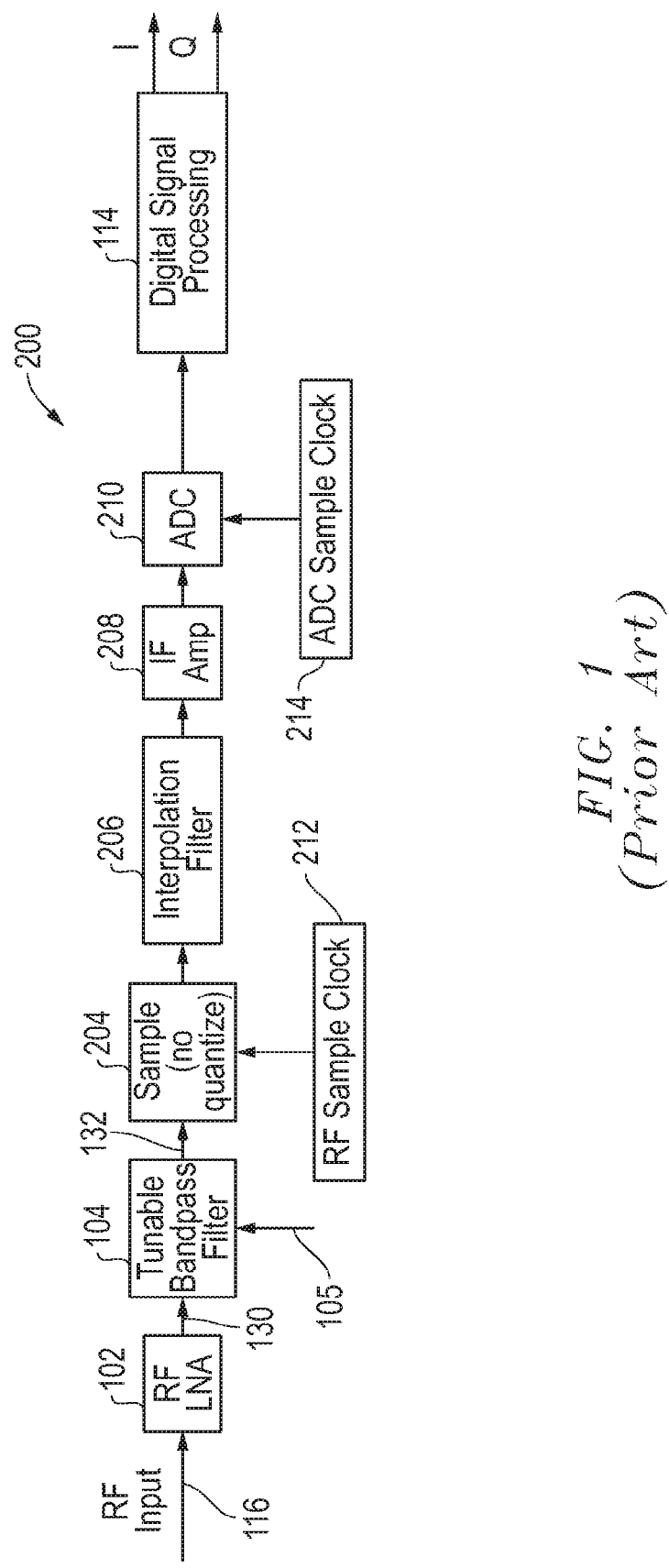
FIG. 1 (Prior Art) is a block diagram for a reconfigurable direct RF bandpass sampling receiver (RDRFBSR).
Figure 2:
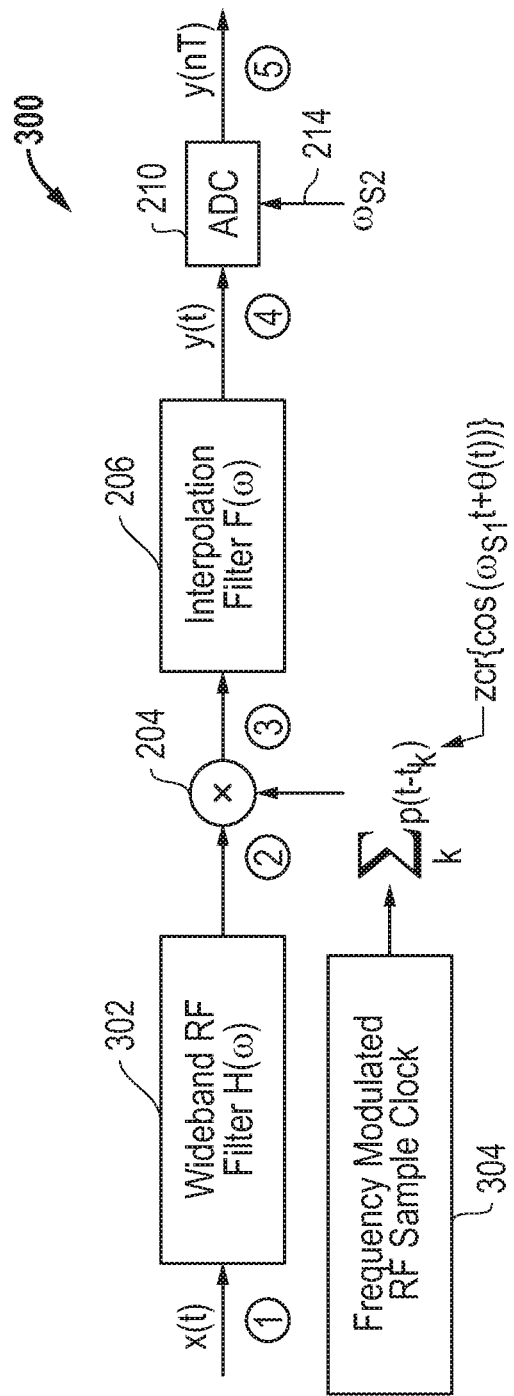
FIG. 2 (Prior Art) is a block diagram for a Nyquist folding receiver (NYFR).
Figure 3:
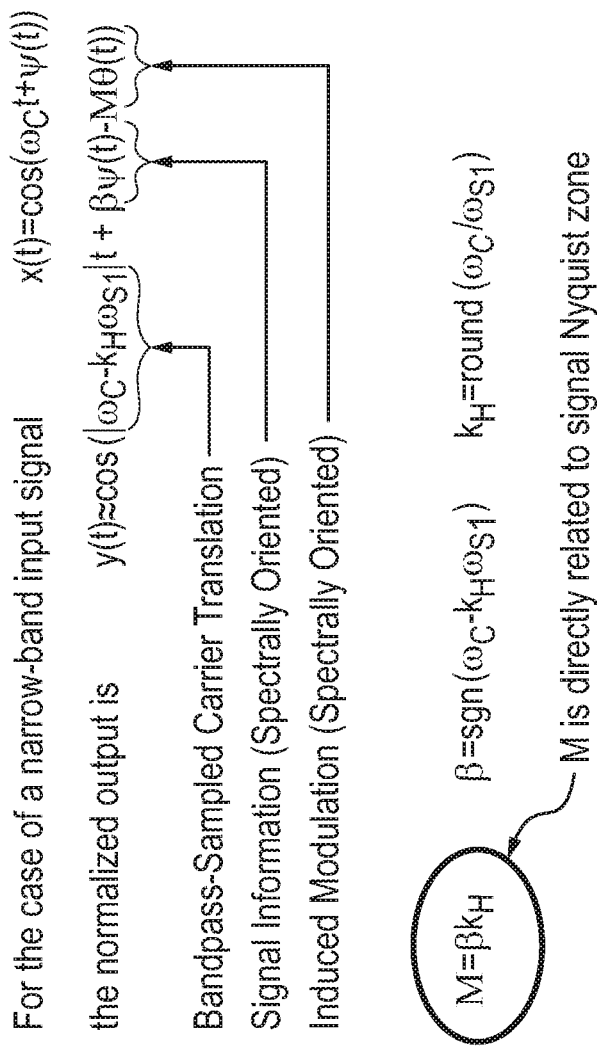
FIG. 3 (Prior Art) provides an explanation of mathematical expressions associated with the NYFR signals.
Figure 4:
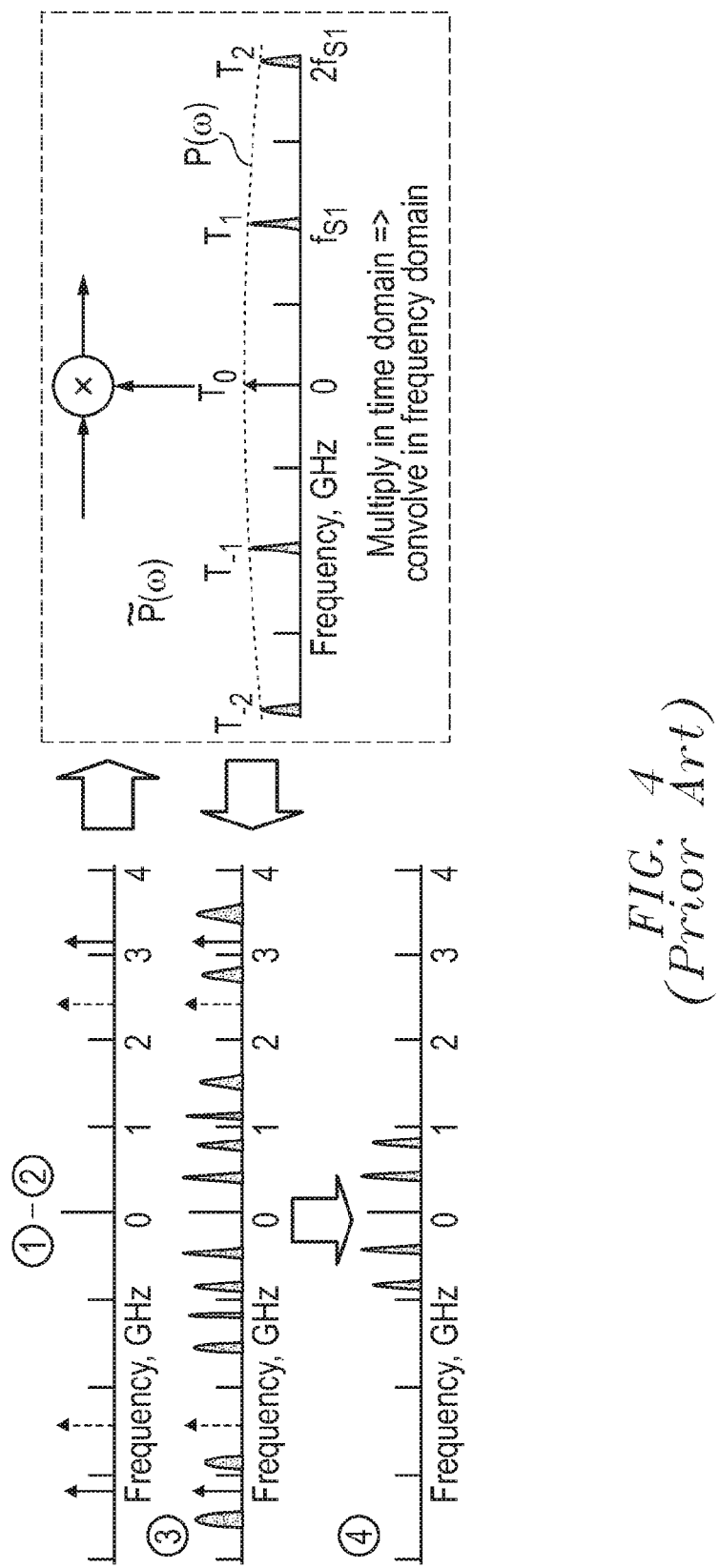
FIG. 4 (Prior Art) is a signal diagram for signal processing provided by the NYFR of FIG. 2.
Figure 5:
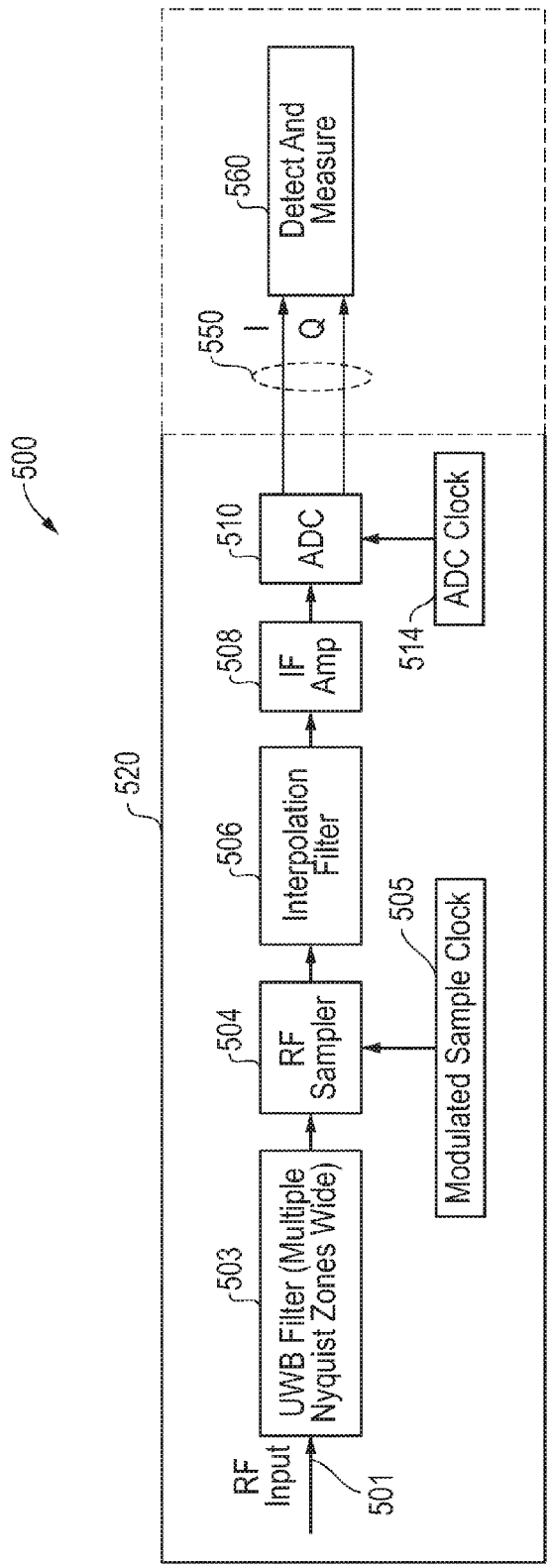
FIG. 5 illustrates a receiver system according to one exemplary embodiment of the disclosed systems and methods.

Disclosed herein are systems and methods for detecting and/or measuring RF signals contained in modulated sample data including, for example, sample data that results from sampling a RF spectrum using modulated sampling clocks or PN codes. FIG. 5 illustrates one exemplary embodiment of a receiver system 500 that includes a modulated data source in the form of a Nyquist Folding Receiver (NYFR) 520 having a particular configuration which takes sub-Nyquist rate digital samples of a wide-band spectral environment, it being understood that a modulated data source may have any other configuration suitable for producing modulated sample data. Examples of such systems include, but are not limited to, NYFR receivers configurations described and illustrated in U.S. Pat. Nos. 7,436,910; 7,436,911; and 7,436,912, each of which is incorporated herein by reference in its entirety. Examples of non-NYFR modulated data sources that may be implemented to produce modulated sample data that includes RF signals that may be detected and measured using the disclosed systems and methods include, but are not limited to, the random demodulator (CMUX) architectures of Rice University (J. P. Slavinsky, J. N. Laska, M. A. Davenport and R. G. Baraniuk, "The Compressive Multiplexer for Multi-Channel Compressive Sensing," ICASSP, 2011), and multi-coset sampling architectures (M. Mishali, Y. C. Eldar, "Blind multiband signal reconstruction: compressed sensing for analog signals," IEEE Transactions on Signal Processing, March 2009), each of the foregoing references being incorporated herein by reference in its entirety.

In the embodiment of FIG. 5, NYFR 520 is configured with a ultra wideband (UWB) front end filter 503 to allow reception of multiple Nyquist zones. NYFR 520 is an example of a receiver configuration that may be advantageous for monitoring very large bandwidths with fairly sparse signal environments. Such a Nyquist folding bandpass receiver has a wider bandwidth / dynamic range combination than other receiver technologies and architectures. Since such a Nyquist folding bandpass receiver can provide signal copy and is capable of being used as a communications receiver for certain applications.

In FIG. 5, NYFR 520 includes a non-quantizing RF sampler 504 followed by an analog interpolation filter 506, an intermediate frequency amplifier (IF Amp) 508, an analog to digital converter (ADC) 210, and digital signal processor (DSP) 514. An ultra wideband (UWB) filter 503 is provided in front of the non-quantizing RF sampler 504 which receives modulated RF sample clock circuitry 304 as shown. In this case, the wideband filter 503 has a bandwidth that is wide enough to pass multiple Nyquist zones where the Nyquist zones are determined by the RF sampling clock frequency for the non-quantizing RF sampler 504. The modulated sample clock circuitry 505 provides an RF sampling clock signal to the non-quantizing RF sampler 504 that is not constant and is adjusted or modulated during sampling to associate particular modulation with particular signals received in RF input 501.

Still referring to FIG. 5, ADC 510 receives an ADC sampling clock signal from ADC clock circuitry 514, which in turn provides in-phase path (I) and quadrature path (Q) signals of modulated sample data 550. As shown, detect and measure circuitry 560 may be coupled to receive digital sample data 550 from the ADC 510. Among other things, detect and measure circuitry 560 may include one or more processing devices programmed to process these digital sample data signals 550 to identify and remove Nyquist-zone specific modulation in order to recover the original signal, e.g., by removing the induced modulation associated with the Nyquist zone in which the signal was located and acquiring the original signal by utilizing the Nyquist zone in which the signal was located, removing an induced modulation for that Nyquist zone, and acquiring the original signal. Other tasks of detect and measure circuitry 560 will be described further herein, and these tasks may be implemented by software, firmware or hardware programming on any one or more processing devices, e.g., such as ASIC, FPGA, DSP, CPU, controller, microcontroller, processor, microprocessor, etc. It will be understood that detect and measure circuitry 560 may be implemented as a circuit component/s that is separate from other components of a NYFR receiver 520 (e.g., NYFR receiver 520 may include a separate DSP that provides digital data to detect and measure circuitry 560), and/or it will be understood that one or more tasks of circuitry 560 may be alternatively implemented by DSP circuitry integral to NYFR 520.

Figure 6:
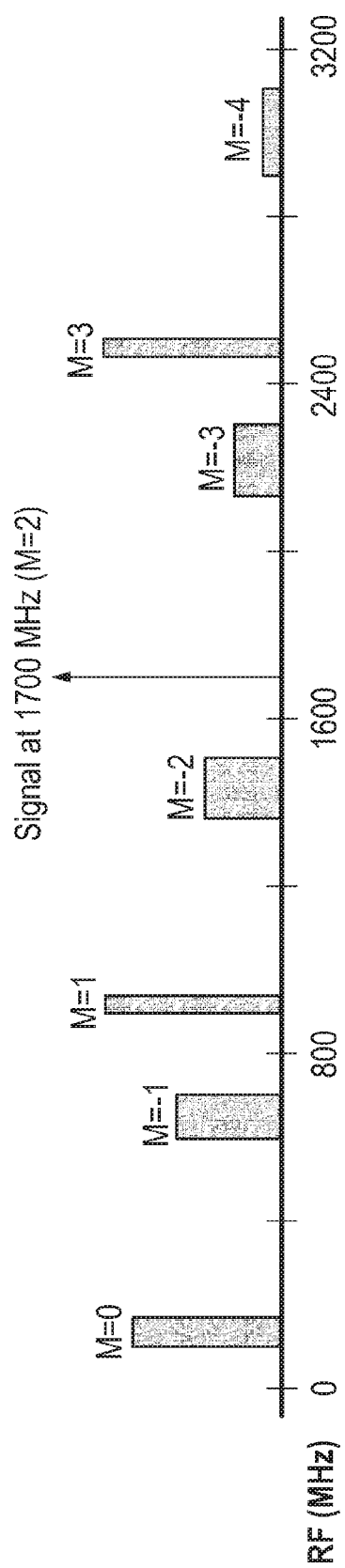
FIG. 6 illustrates an example RF spectrum and its aliased spectra produced by a RF sampler of the receiver system of FIG. 5.

FIG. 6 illustrates the RF spectrum of a 1700 MHz signal and its aliased spectra that are produced by RF sampler 504 of NYFR 520 after sampling at an average rate of 800 Msps. As shown, each frequency interval of length 400 MHz (one-half the sampling frequency, i.e., the Nyquist rate) has a unique fold number M associated with it. Each such interval may be referred to as a Nyquist Zone and the true signal is located at M=2. Each aliased spectrum at surrounding M values picks up induced modulation whose bandwidth is equal to its distance from the true signal (in M value) multiplied by the bandwidth of the underlying NYFR clock modulation with negative M values corresponding to spectrally reversed aliased spectra.

In the embodiment of FIG. 5, the signal in FIG. 6 is passed through interpolation filter 506 which is configured to act as a lowpass filter to eliminate all but the aliased spectra in Nyquist Zone zero, and so that only the frequency band M=0 is preserved. As a result, the resulting digital (IQ) samples x[n] produced by the ADC 510 and present in digital sample data 550 only reflect the aliased spectrum with fold number zero, i.e., 0 to 400 MHz.

Figure 7:
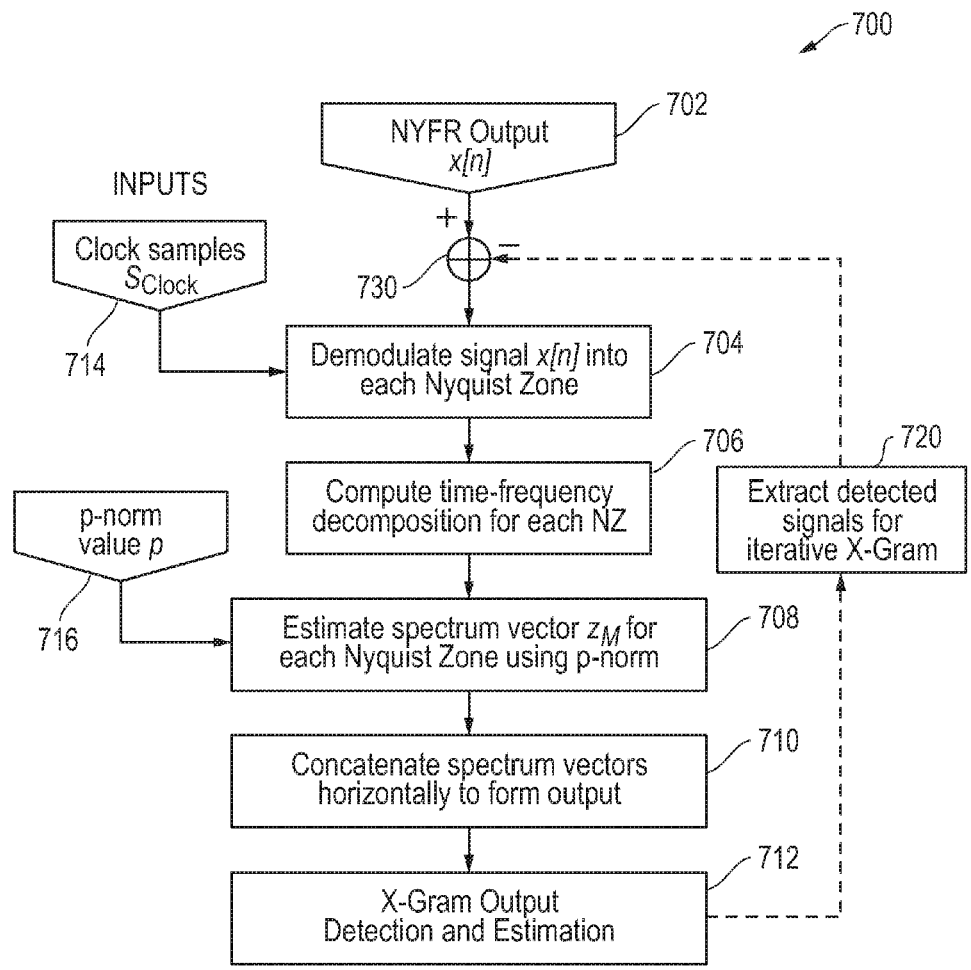
FIG. 7 illustrates a flow chart of methodology according to one exemplary embodiment of the disclosed systems and methods.

FIG. 7 illustrates a flow chart of a methodology 700 that may be implemented (e.g., by a processing device/s of detect and measure circuitry 560) according to one exemplary embodiment. In step 702, modulated digital sample data 550 (e.g., IQ data) is received by detect and measure circuitry 560. Optional detected signal subtraction step 730 may then be implemented in optional subsequent iterative passes of methodology 700 in a manner as will be described further herein. Next, in step 704, each signal x[n] of the sample data output 550 is demodulated into each Nyquist Zone by constructing the signal as it would appear in every Nyquist Zone. For example, given digital IQ samples $s_{Clock}[n]$ 714 of the underlying NYFR clock modulation (e.g., recovered from pilot tone injected by NYFR 520), it is possible to produce digital samples of the signal aliases at any fold number by demodulating the non-uniform clock modulation via the equation:

$$x_M[n] = x[n]\exp(-jMs_{Clock}[n])$$

It will be understood that in other embodiment where the clock samples are not known a priori, then the clock may be extracted from some known or injected pilot tone in x[n].

Next, in step 706, a time-frequency decomposition may be computed or estimated for each of the Nyquist Zones. For example, in one embodiment a time-frequency representation (spectrogram) of each Nyquist Zone may be computed by selecting an appropriate time block size $N_{FFT}$ and utilizing the following equation:

$$B_M[u, k] = \sum_{i=0}^{N_{FFT}-1} x_M[uN_{FFT} + i]\exp\left(-\frac{j2\pi ki}{N_{FFT}}\right)$$

Here, u represents a time-block (of which there are $N/N_{FFT}$ where N is the total number of digital samples) and k represents frequency bin index (which is related to fold frequency by $f_{IF} = kf_{S2}/2$ where $f_{S2}$ is the ADC sample rate of the NYFR). It will be understood that any other suitable alternative methodology may be employed to estimate or compute a time-frequency representation.

In step 708, a p-norm value 716 may be optionally used to collapse the temporal axis of each spectrogram so as to create spectral estimates that are more robust to shorter duration signals. A suitable p-norm value 716 may be predefined, for example, based on a desired or selected balance of pulsed signal strength compared to continuous signal strength. For example, in one exemplary embodiment, the Fourier spectrum of each Nyquist zone may be estimated by projecting out the temporal axis of each spectrogram using a p-norm. This forms a set of column vectors $z_M$, each of length $N_{FFT}$ that take the following form:

$$z_M[k] = \|B_M[\cdot, k]\|_p = \left(\sum_{u=0}^{N/N_{FFT}-1} |B_M[u, k]|^p\right)^{1/p}$$

Figure 13:
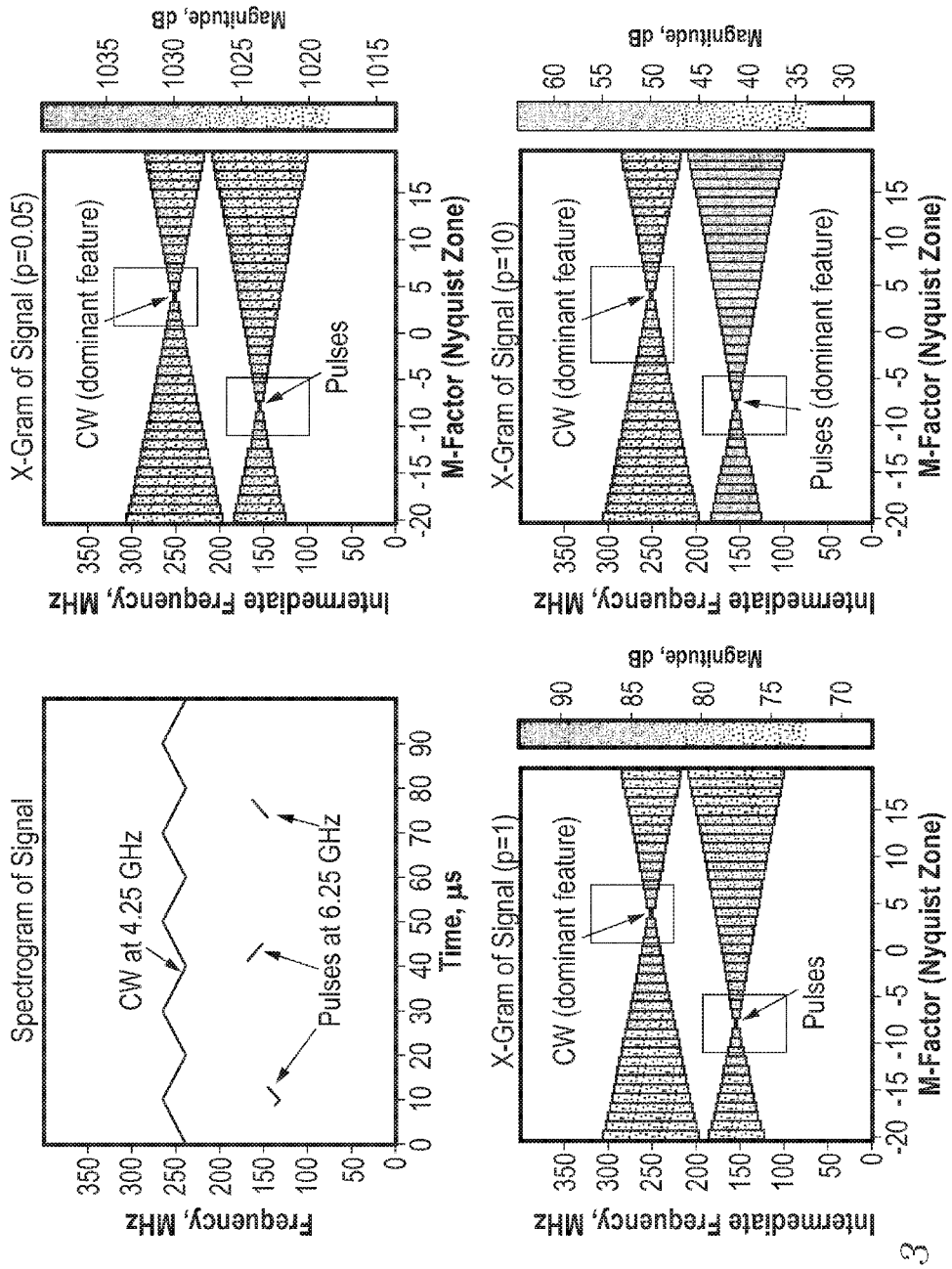
FIG. 13 illustrates output magnitude matrix images (X-grams) according to exemplary embodiments of the disclosed systems and methods.

Here, p can be selected to be any value (e.g., any real number) in the interval (0, ∞). For small values of p (e.g., p<2), continuous signals contribute more to the $z_M$'s than pulsed signals. For large values of p (e.g., p≥2), pulsed signals are better represented than continuous signals. In this regard, higher values of p tend to emphasize peak power more than average power, increasing visibility of pulsed signals relative to CW signals. Thus, step 708 may be implemented in one exemplary embodiment to use a p-norm along the time axis of a spectrogram rather than simply using the direct discrete Fourier transform (DFT) over the entire signals to reduce or substantially avoid attenuation of pulsed signals and to offer the possibility of trading off continuous wave (CW) signals in favor of pulsed signals as illustrated in the embodiment of FIG. 13.

Figure 8:
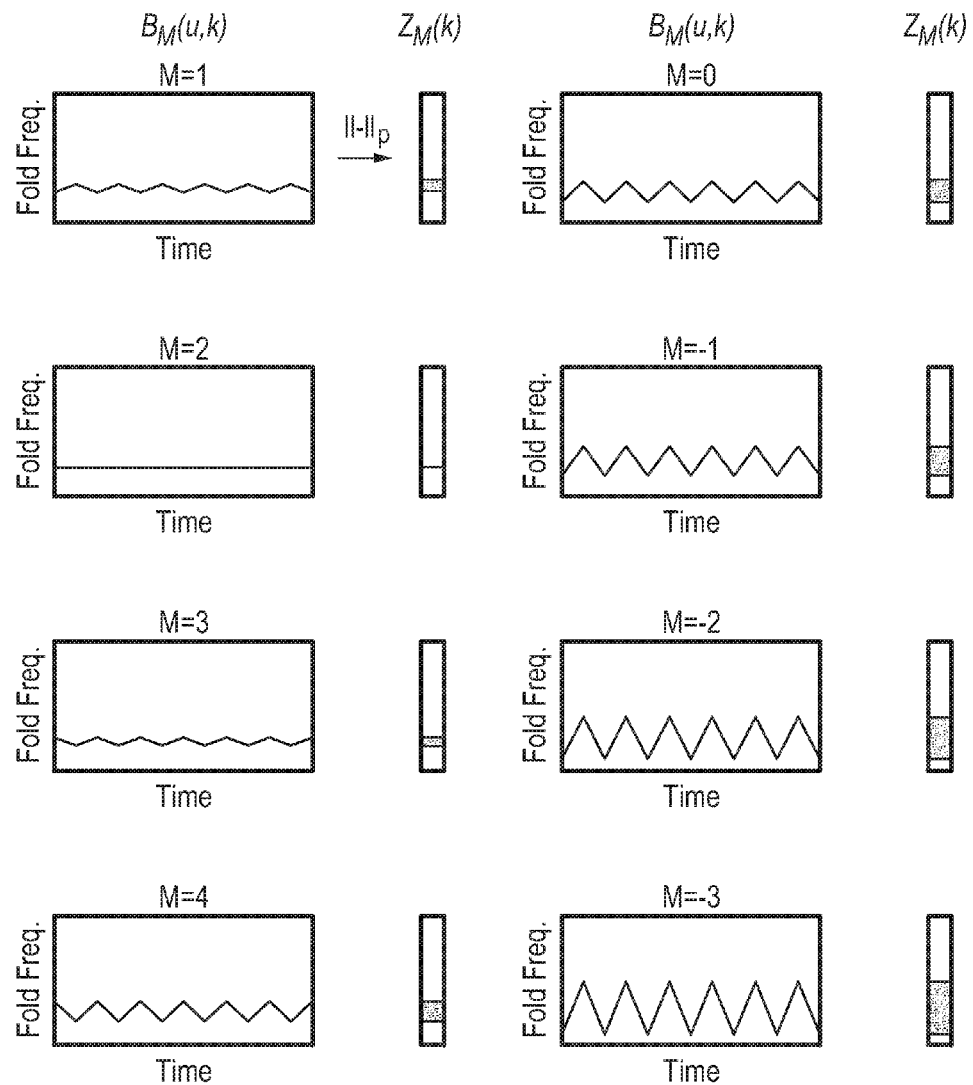
FIG. 8 illustrates spectrograms and spectral estimates according to one exemplary embodiment of the disclosed systems and methods.

FIG. 8 illustrates how spectral estimates $z_M$ may be formulated in step 708 for each Nyquist Zone in the exemplary embodiment of FIG. 6 by calculating a spectrogram and subsequently applying a p-norm along the time axis. Specifically, FIG. 8 illustrates computation of a spectrogram $B_M(u, k)$ for each fold interval (Nyquist Zone) and its corresponding spectrum estimate $z_M(k)$ using a p-norm. In this embodiment, the NYFR output x[n] is multiplied by $\exp(-jMs_{Clock}[n])$ for each Nyquist Zone as in 704. A spectrogram may then be computed for each of the resulting products (706). Each spectrogram is then temporally compressed into a column vector using a p-norm and appropriately chosen p-norm value (708). As shown, the computer spectrogram for Nyquist zone (i.e., M=2) corresponding to the true signal at 1700 MHz exhibits a substantially flat frequency versus time, whereas the computed spectrograms for each of the incorrect Nyquist zones (i.e., M=0, 1, −1, −2, 3, −3, 4) exhibit varying frequency as a function of time.

Figure 9:
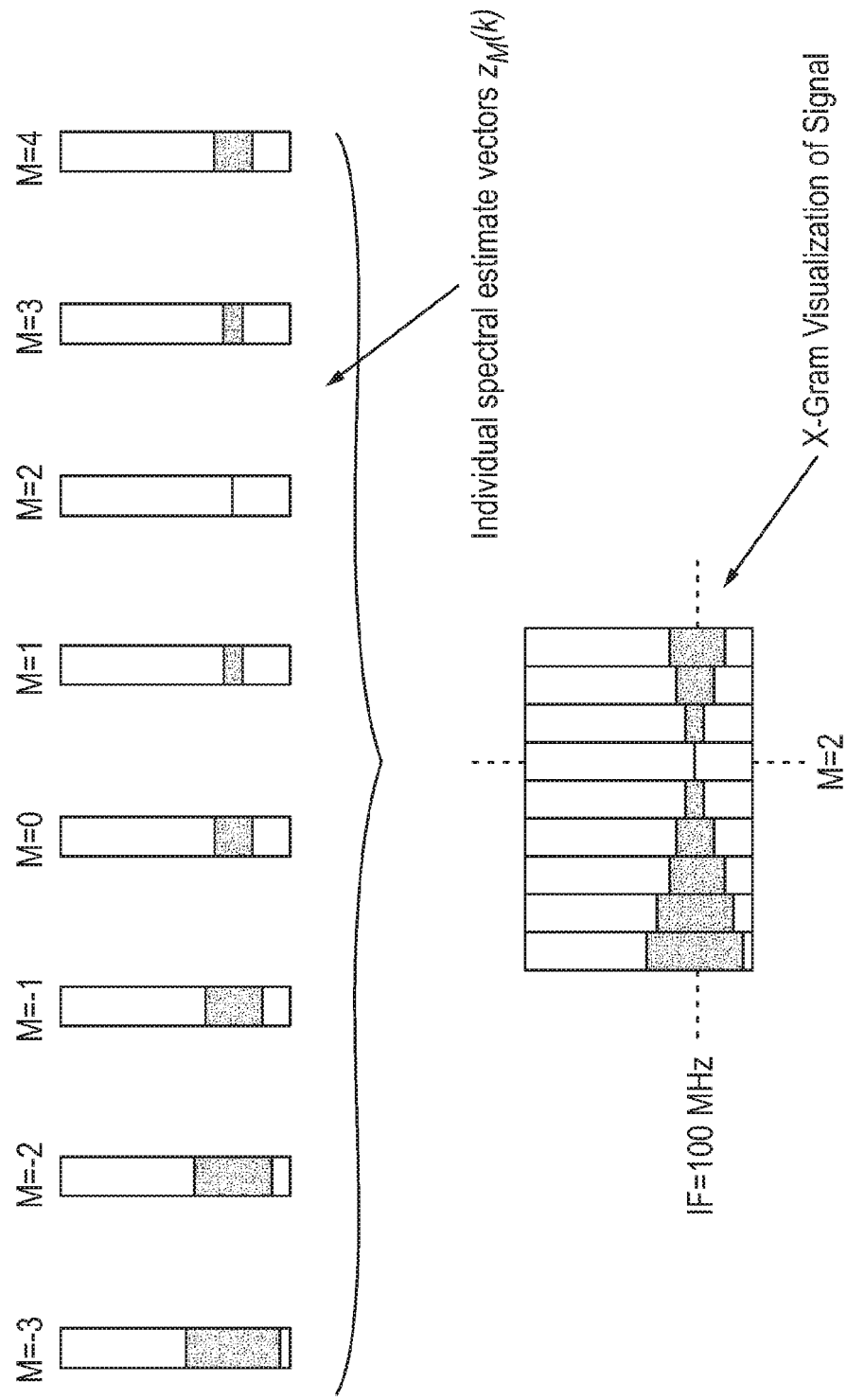
FIG. 9 illustrates a magnitude matrix image ("X-gram") according to one exemplary embodiment of the disclosed systems and methods.

Next, in step 710, the spectral estimates $z_M$ of each Nyquist Zone computed in step 708 may be concatenated in order to create an output magnitude matrix. In one embodiment, this may be accomplished by constructing a fold-number/fold-frequency representation of the signal space by concatenating the column vectors $z_M$ horizontally so that the corresponding M values are in increasing order, e.g., as illustrated by the magnitude matrix image ("X-gram") depicted in FIG. 9 in which individual spectral estimate vectors $z_M(k)$ of FIG. 8 are arranged in side by side relationship in increasing order of M (as a representation of sample zone frequency as a function of sample zone identity) with the correct vector $z_M$ (corresponding to M=2 in this embodiment) being present at the center point of the "X" shaped image formed by the data. It is noted that this M value order may not be the same order with which spectral components appear in the RF space (e.g., see FIG. 6).

In step 712, the output magnitude matrix may be processed manually or in automated manner for purposes of signal detection and estimation. In this regard, manual processing or, for example, an automated local peak search algorithm which may be used to identify the RFs of signals that are present. In one embodiment, the output magnitude matrix from step 710 may be visualized in step 712 as a two-dimensional digital image (e.g., displayed to a user on a display device that is coupled to a processing device/s of detect and measure circuitry 560) with M being represented on the horizontal axis and fold frequency represented on the y-axis. In such an embodiment, each pixel may correspond to an M number/fold frequency pair, which maps bijectively into a unique RF. A color map may be used to define whether there is spectral activity at a particular RF. In the output magnitude matrix of step 710, a continuous signal (or a pulsed signal of sufficient length and duty cycle) manifests itself as a filled "X-shaped" region whose center point corresponds to the RF of that signal. The tails of the X are generated by the aliases of that signal. If a shorter duration pulsed signal is only in the 'on' mode during certain portions of the clock modulation's period, then only a subset of an X may be visible.

In another exemplary embodiment, an automated local peak search algorithm may be employed for detecting signals in the output frequency (IF) versus M-factor magnitude matrix image (X-gram) of step 712 of methodology 700. In this embodiment, the algorithm may first pick out local maxima within the X-Gram image. Then for each detected local maximum, a symmetry check may then be conducted. If the local maximum exhibits both vertical and horizontal symmetry, then it is classified as a signal; otherwise, the point is classified to be a pseudo-center that does not correspond to any signal. A simple criterion for evaluating this symmetry involves taking the points immediately to the left and right of the maximum and examining the absolute difference between the two. If the difference does not surpass a threshold, then horizontal symmetry is present. The analogous operation is conducted in the vertical direction. It will be understood that in other embodiments, additional and/or alternative criteria may be employed to separate true X-centers from pseudo-centers including, but not limited to, iteratively extracting the single strongest detected signal component corresponding to any X-center as shown in 720 (which will remove any pseudo X-centers that are co-linear with the former); searching for X-centers that cannot be reconciled by the intersection of two rays emanating from other X-centers; confirming the existence of a signal at the radio frequency corresponding to the detected X-center via the use of a spectrogram at the Nyquist Zone corresponding to said X-center; etc. Once all the local maxima have been classified, then the detected signals may be optionally stripped out of the original modulated sample data in step 730 so that optional second and additional passes of methodology 799 may be performed as desired.

Figure 10:
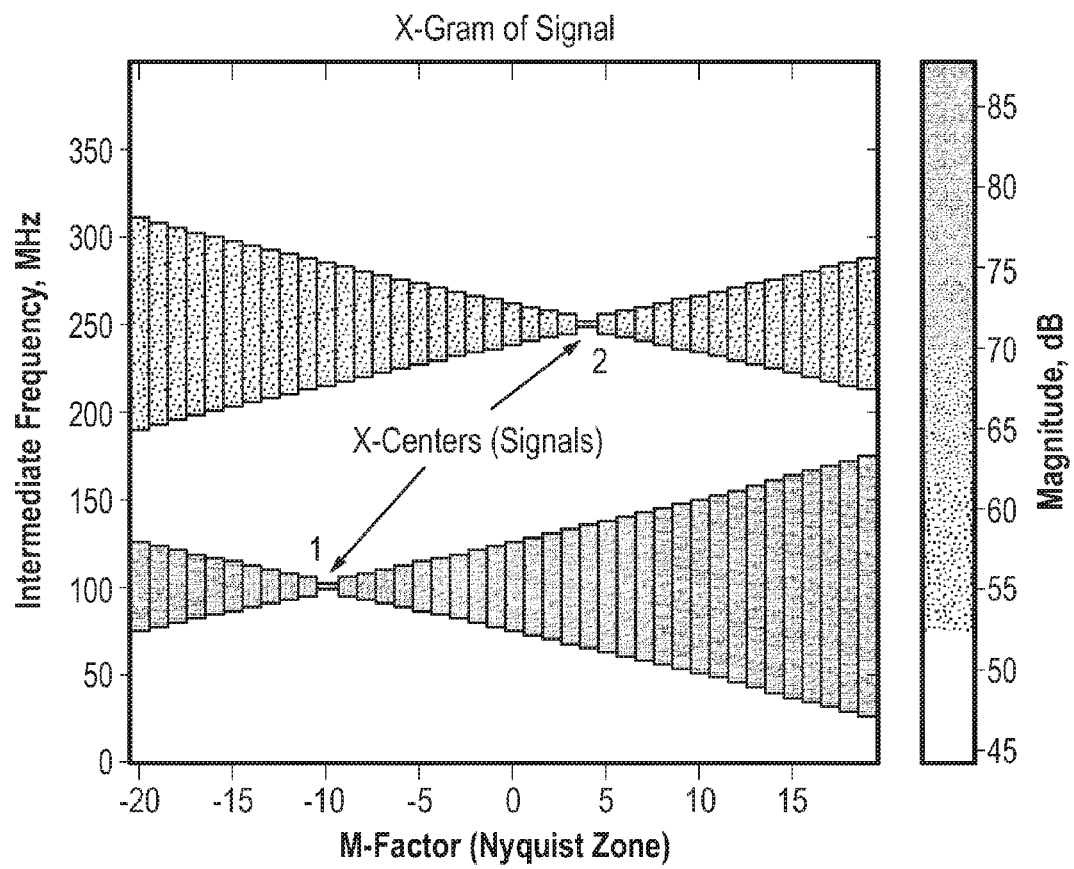
FIG. 10 illustrates an output magnitude matrix image (X-gram) according to one exemplary embodiment of the disclosed systems and methods.
Figure 11:
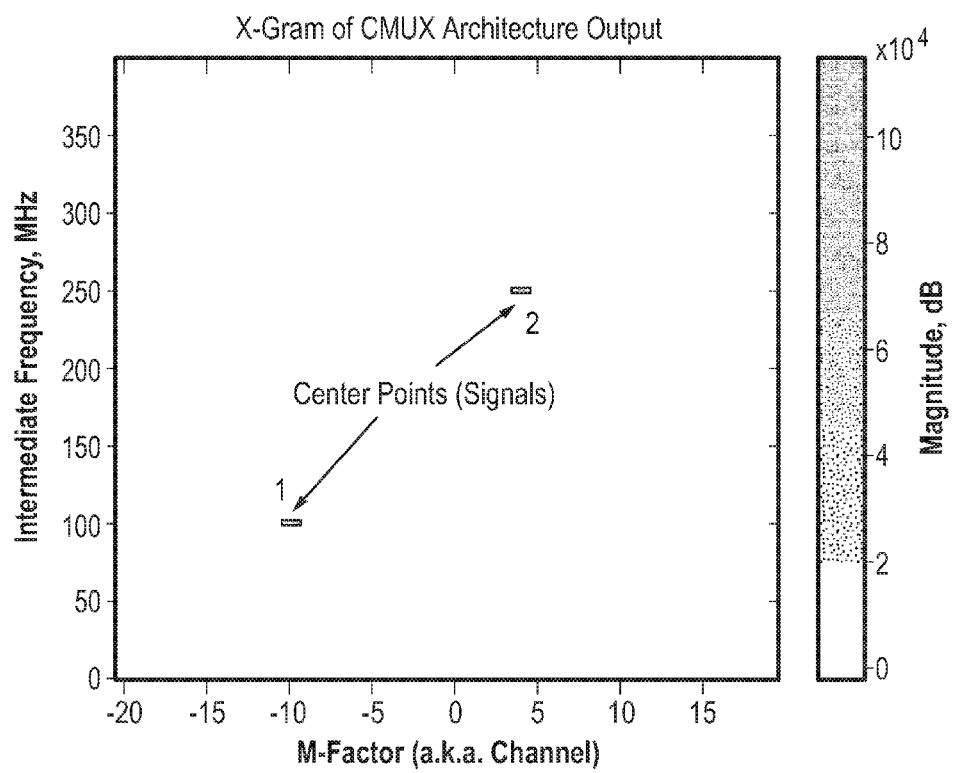
FIG. 11 illustrates an output magnitude matrix image (X-gram) according to one exemplary embodiment of the disclosed systems and methods.

FIG. 10 illustrates one example of an output magnitude matrix image (X-gram) of step 712 when methodology 700 is applied to a simulated RF environment with two signal components in an RF input signal 501: one at 7.90 GHz and the other at 3.45 GHz. In the output magnitude matrix image (X-gram) of FIG. 10, two X shapes with respective center points or "X-Centers" (1) and (2) are clearly visible. These center points of the X shapes correspond uniquely to the frequencies 7.90 GHz and 3.45 GHz. Although the image of FIG. 10 was generated from NYFR modulated sample data 550, it will be understood that the methodology 700 of FIG. 7 is compatible with the modulated sample data output generated by any other type of folding receiver architecture or methodology. For example, FIG. 11 shows an output magnitude matrix image (X-gram) generated by the methodology 700 of FIG. 7 for the same signal input signal 501 (i.e., having signal components at 7.90 GHz and at 3.45 GHz), with the only difference being that the signal 501 was sampled using a Rice University compressive multiplexer (CMUX) receiver such as described in J. P. Slavinsky, J. N. Laska, M. A. Davenport and R. G. Baraniuk, "The Compressive Multiplexer for Multi-Channel Compressive Sensing," ICASSP, 2011. In the alternative CMUX embodiment of FIG. 11, two isolated signal center points (rather than X-Centers) correspond uniquely to the frequency components 7.90 GHz and 3.45 GHz of input signal 501.

In optional step 720, detected signals from step 712 may be extracted for iterative processing using methodology 700 of FIG. 7. This iterative step 720 may be performed to filter and isolate relatively stronger detected signal components that may then be subtracted in optional step 730 from the original digital data 550 in an iterative manner so as to allow detection of relatively weaker signals, and/or to assist in the detection and estimation of signal components in a high dynamic range environment. In this regard, relatively stronger extracted signals may be detected in a first pass of methodology 700 and then removed by filtering and subtraction from the original NYFR output x[n] in step 730 to form a residual signal, which may then be processed in a second or subsequent pass using steps 704-712 in order to detect relatively weaker signals that were not visible in the previous pass/es of methodology 700. This process may be iteratively repeated for any number of times as needed or desired, e.g., to detect and estimate all potential signals of interest in original modulated digital sample data 550, or until some other termination condition/s is satisfied. Examples of possible termination conditions include, but are not limited to, detection of all signals present above a given signal strength or signal-to-noise threshhold, detection of a given minimum number of signals, completion of a designated finite number of iterations, iteration until the signal energy falls below a designated energy threshold, etc.

Figure 15:
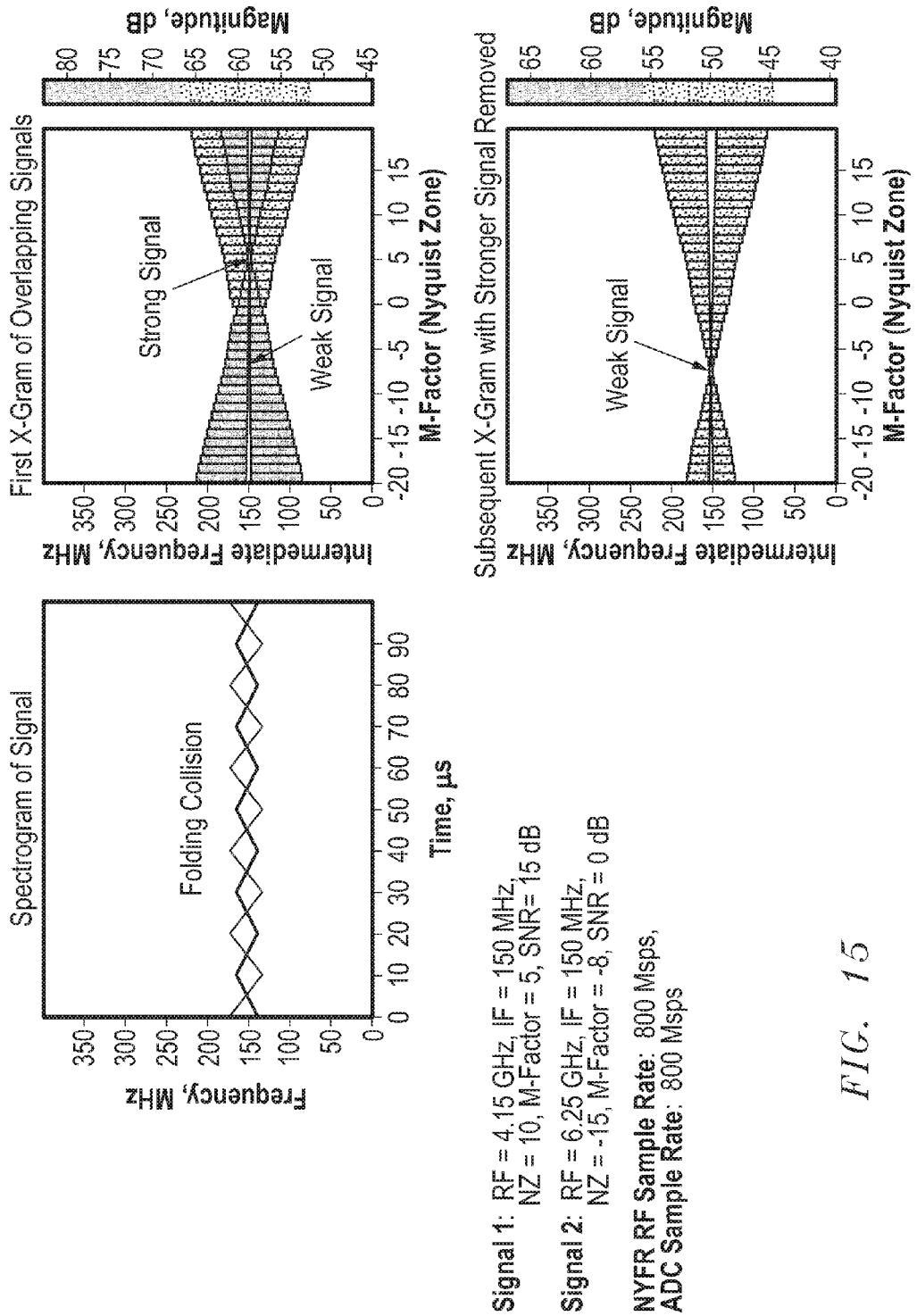
FIG. 15 illustrates an output magnitude matrix image (X-gram) according to one exemplary embodiment of the disclosed systems and methods.

FIG. 15 illustrates a folding collision example of a strong signal component that is present together with a weak signal component in a spectrogram. FIG. 15 also illustrates how the detected strong signal component is present together with the weak signal in a first output magnitude matrix image (X-gram) of step 712, and how this detected strong signal may be filtered out after performing steps 720 and 730 in order to form a subsequent output magnitude matrix image (X-gram) in step 712 that only includes the weaker signal component as shown.

Figure 12:
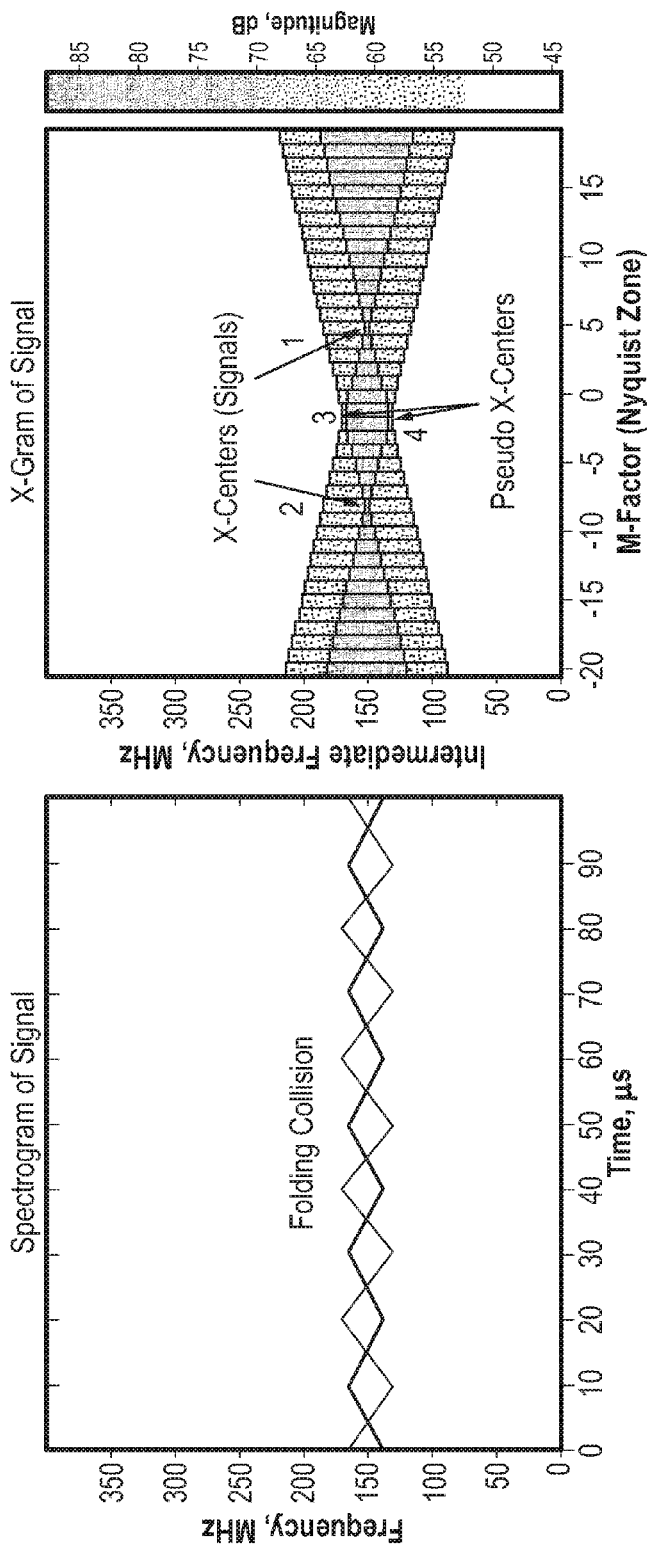
FIG. 12 illustrates an output magnitude matrix image (X-gram) according to one exemplary embodiment of the disclosed systems and methods.

FIG. 12 illustrates an output magnitude matrix image (X-gram) of step 712 when methodology 700 is applied to a simulated RF environment where two signals of sampled digital data 550 fold to the same fold frequency from different Nyquist zones (M-factor values). As shown in FIG. 12, the disclosed systems and methods may be implemented to resolve spectral collisions caused by two such signals folding to the same frequency. In particular, the output image of FIG. 12 shows four potential X-center points, two of which (i.e., points 1 and 2) correspond to the actual signals at 4.15 GHz and 6.25 GHz and the other two are pseudo-center points (i.e., points 3 and 4) that do not correspond to any signal. In such an example, it is relatively straight forward for an operator or algorithm to differentiate between a true X-center point and a pseudo-center points due to the fact that the neither of the pseudo-center points exhibit horizontal or vertical symmetry in its immediate neighborhood. This differentiation allows the output magnitude matrix image (X-gram) to be used to directly discriminate between two signals in the presence of a folding collision without the need or use of compressive sensing algorithms. Moreover, as shown, the output magnitude matrix image (X-gram) depicts the intermediate frequency (IF) and M-factor value for each signal at each center points 1 and 2, from which original RF value may be calculated for each signal, e.g., manually by human user or in automated fashion by algorithm. Such an output magnitude matrix image (X-gram) of step 712 may be visually displayed in one embodiment (e.g., on a display device coupled to detect and measure circuitry 560 of FIG. 5) as an interactive graphical user interface (GUI) which may be implemented by detect and measure circuitry to allow a user to zoom-in interactively on the depicted center points 1 and 2 (after visually located the individual X shaped patterns) in order to obtain a more accurate reading of frequency and/or M-factor FIG. 13 illustrates an output magnitude matrix image (X-gram) of step 712 when methodology 700 is applied utilizing 3 different p-values in step 708 to a simulated RF environment that includes a signal that consists of a continuous wave (CW) and some pulses. As shown in FIG. 13, when p=0.05, the CW appears to be stronger than the pulsed signal. When p=10, the pulsed signal appears to be stronger than the CW. In this example case, a selected value of p=1 provides a neutral profile of both signal components.

Figure 14:
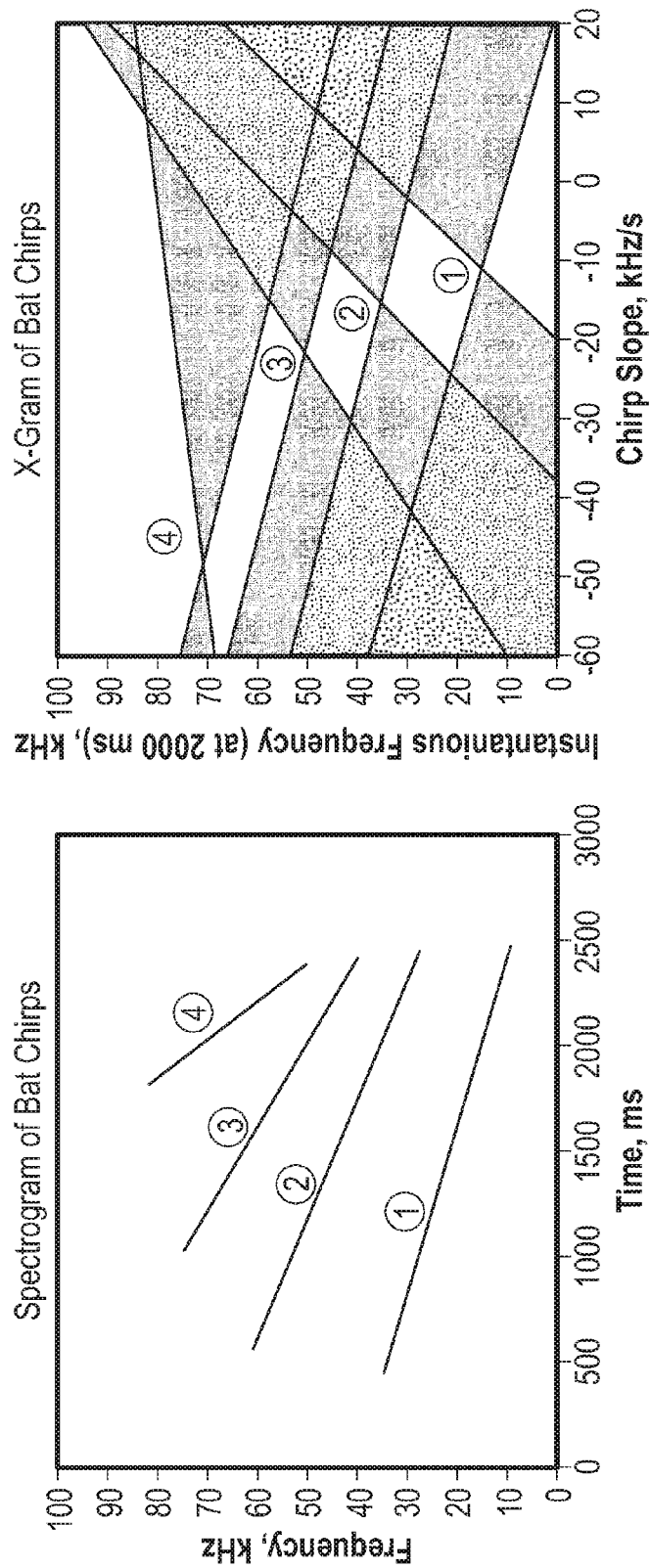
FIG. 14 illustrates an output magnitude matrix image (X-gram) according to one exemplary embodiment of the disclosed systems and methods.

The preceding embodiments have been described in relation to processing sample data that includes receiver-induced modulation by constructing a surface for the extraction of induced receiver modulation (e.g., NYFR-induced modulation). However, it will be understood that the disclosed systems and methods may also be implemented to detect and classify signals by classification of source-induced modulations that originate from a signal source, independent of receiver architecture. One such embodiment is the detection and classification of Linear FM-modulated signals (chirps). An example of such signals is bat sonar. It has been observed that bat sonar signals often consist of a small number of chirp components. The disclosed systems and methods may be employed to determine the structure and chirp rates of such signals. For example, FIG. 14 illustrates results of application of the methodology 700 of FIG. 7 to a generic model of bat sonar that includes four chirp components (1, 2, 3 and 4), and the determination of the linear chirp rates of these bat chirps. In this case, the Nyquist Zones (or M-factors) correspond to multiples of a fundamental chirp slope.

It will be understood that one or more of the tasks, functions, or methodologies described herein (e.g., including for the implementation of methodology 700 by one or more processing devices of detect and measurement circuitry 560) may be implemented, for example, by software, firmware or other computer program of instructions embodied in a non-transitory tangible computer readable medium that is executed by a CPU, controller, microcontroller, processor, microprocessor, FPGA, ASIC, or other suitable processing device.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A signal processing system, comprising:
one or more processing devices configured for coupling to receive modulated sample data including one or more signals contained in multiple different sample zones, each of the sampled zones being non-uniformly sampled to induce a unique modulation on signals that is dependent on the particular sample zone of origin;
where the one or more processing devices are programmed to:
(a) demodulate each of the one or more signals in each of the multiple non-uniformly sampled sample zones,
(b) produce a time-frequency representation of each of the multiple sample zones,
(c) obtain a magnitude representation of each given one of the multiple sample zones from a corresponding time-frequency representation for the given sample zone, and
(d) create an output magnitude matrix by concatenating the multiple magnitude representations of the multiple sample zones.

2. The system of claim 1, where the output magnitude matrix comprising a representation of sample zone frequency as a function of sample zone identity; and where the one or more processing devices are programmed to visually display the output magnitude matrix on a display device.

3. The system of claim 1, where the one or more processing devices are programmed to detect signals in the output magnitude matrix by performing a local peak search.

4. The system of claim 1, where the one or more processing devices are further programmed to:
obtain a magnitude representation of each given one of the multiple sample zones by projecting out a temporal axis of a spectrogram of each produced time-frequency representation of each of the multiple sample zones using a p-norm value to form a set of column vectors $z_M$; and
to create an output magnitude matrix by concatenating the column vectors $z_M$ horizontally so that the corresponding sample zones are positioned in ordered relationship.

5. The system of claim 1, where the one or more processing devices are further programmed to subtract one or more detected signals from the received modulated sample data to produce modified modulated sample data after creating a first output magnitude matrix; and
then using the detection and measurement circuitry to iteratively repeat steps (a) through (d) using the modified modulated sample data to create a second and different output magnitude matrix.

6. The system of claim 1, where the modulated sample data comprises sample data produced by sampling an RF input signal using a non-uniform sampling clock; and where each of the different sample zones comprises a different Nyquist zone.

7. The system of claim 1, where the modulated sample data comprises sample data produced by sampling an RF input signal using orthogonal PN codes.

8. A signal receiving and processing system, comprising:
a modulated data source configured to sample an input signal to produce modulated sample data from the input signal by applying a unique modulation to individual sampled zones that is dependent on the particular sample zone of origin, the modulated sampling data including one or more signals contained in multiple different sample zones; and
one or more processing devices programmed to:
(a) demodulate each of the one or more signals in each of the multiple non-uniformly sampled sample zones,
(b) produce a time-frequency representation of each of the multiple sample zones,
(c) obtain a magnitude representation of each given one of the multiple sample zones from a corresponding time-frequency representation for the given sample zone, and
(d) create an output magnitude matrix by concatenating the multiple magnitude representations of the multiple sample zones.

9. The system of claim 8, where the output magnitude matrix comprising a representation of sample zone frequency as a function of sample zone identity; and where the one or more processing devices are programmed to visually display the output magnitude matrix on a display device.

10. The system of claim 8, where the one or more processing devices are programmed to detect signals in the output magnitude matrix by performing a local peak search.

11. The system of claim 8, where the one or more processing devices are further programmed to:
obtain a magnitude representation of each given one of the multiple sample zones by projecting out a temporal axis of a spectrogram of each produced time-frequency representation of each of the multiple sample zones using a p-norm value to form a set of column vectors $z_M$; and
to create an output magnitude matrix by concatenating the column vectors $z_M$ horizontally so that the corresponding sample zones are positioned in ordered relationship.

12. The system of claim 8, where the one or more processing devices are further programmed to subtract one or more detected signals from the received modulated sample data to produce modified modulated sample data after creating a first output magnitude matrix; and then using the detection and measurement circuitry to iteratively repeat steps (a) through (d) using the modified modulated sample data to create a second and different output magnitude matrix.

13. The system of claim 8, where the modulated data source is configured to sample the RF input signal using a non-uniform sampling clock to produce the modulated sample data; and where each of the different sample zones comprises a different Nyquist zone.

14. The system of claim 8, where the modulated data source is configured to sample the RF input signal using orthogonal PN codes to produce the modulated sample data.

15. A method, comprising:
providing detection and measurement circuitry implemented by one or more processing devices;
receiving modulated sample data in the detection and measurement circuitry, the modulated sampled data including one or more signals contained in multiple different sample zones, and each of the sampled zones being non-uniformly sampled to induce a unique modulation on signals that is dependent on the particular sample zone of origin; and
using the detection and measurement circuitry to:
(a) demodulate each of the one or more signals in each of the multiple non-uniformly sampled sample zones,
(b) produce a time-frequency representation of each of the multiple sample zones,
(c) obtain a magnitude representation of each given one of the multiple sample zones from a corresponding time-frequency representation for the given sample zone, and
(d) create an output magnitude matrix by concatenating the multiple magnitude representations of the multiple sample zones.

16. The method of claim 15, where the output magnitude matrix comprising a representation of sample zone frequency as a function of sample zone identity; and where the method further comprises visually displaying the output magnitude matrix to a user.

17. The method of claim 15, further comprising using the detection and measurement circuitry to detect signals in the output magnitude matrix by performing a local peak search.

18. The method of claim 15, further comprising using the detection and measurement circuitry to:
obtain a magnitude representation of each given one of the multiple sample zones by projecting out a temporal axis of a spectrogram of each produced time-frequency representation of each of the multiple sample zones using a p-norm value to form a set of column vectors $z_M$; and
to create an output magnitude matrix by concatenating the column vectors $z_M$ horizontally so that the corresponding sample zones are positioned in ordered relationship.

19. The method of claim 15, further comprising using the detection and measurement circuitry to subtract one or more detected signals from the received modulated sample data to produce modified modulated sample data after creating a first output magnitude matrix; and then using the detection and measurement circuitry to iteratively repeat steps (a) through (d) using the modified modulated sample data to create a second and different output magnitude matrix.

20. The method of claim 15, where the modulated sample data comprises sample data produced by sampling an RF signal input using a non-uniform sampling clock; and where each of the different sample zones comprises a different Nyquist zone.

21. The method of claim 15, where the modulated sample data comprises sample data produced by sampling an RF input single using orthogonal PN codes.

* * * * *